United States Patent
Yu et al.

(10) Patent No.: US 8,686,393 B2
(45) Date of Patent: Apr. 1, 2014

(54) INTEGRATED CIRCUIT SEMICONDUCTOR DEVICES INCLUDING CHANNEL TRENCHES AND RELATED METHODS OF MANUFACTURING

(75) Inventors: Jihyung Yu, Uiwang-si (KR); Daewon Ha, Seoul (KR); Song yi Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 212 days.

(21) Appl. No.: 13/349,714

(22) Filed: Jan. 13, 2012

(65) Prior Publication Data

US 2012/0248400 A1 Oct. 4, 2012

(30) Foreign Application Priority Data

Mar. 29, 2011 (KR) .................. 10-2011-0028315

(51) Int. Cl.
*H01L 29/06* (2006.01)
(52) U.S. Cl.
USPC .......... 257/5; 257/E47.001; 257/75; 365/49.1
(58) Field of Classification Search
USPC ................. 257/E47.001, 75, 5; 365/49.1
See application file for complete search history.

(56) References Cited

U.S. PATENT DOCUMENTS

| | | | |
|---|---|---|---|
| 2005/0056892 A1* | 3/2005 | Seliskar | 257/348 |
| 2005/0263801 A1 | 12/2005 | Park et al. | |
| 2006/0148229 A1 | 7/2006 | Wang et al. | |
| 2009/0057756 A1* | 3/2009 | Hshieh | 257/330 |
| 2009/0184306 A1 | 7/2009 | Mathew et al. | |
| 2009/0267125 A1* | 10/2009 | Mikasa et al. | 257/300 |
| 2010/0072451 A1* | 3/2010 | Terao et al. | 257/4 |
| 2010/0090270 A1* | 4/2010 | Hsieh | 257/328 |
| 2010/0096613 A1* | 4/2010 | Morikawa et al. | 257/4 |
| 2010/0295123 A1* | 11/2010 | Lung et al. | 257/334 |
| 2011/0133310 A1* | 6/2011 | Anderson et al. | 257/532 |
| 2011/0180862 A1* | 7/2011 | Anderson et al. | 257/296 |

FOREIGN PATENT DOCUMENTS

KR 1020090081302 7/2009

* cited by examiner

*Primary Examiner* — Julio J Maldonado
*Assistant Examiner* — Robert Bachner
(74) *Attorney, Agent, or Firm* — Myers Bigel Sibley & Sajovec, P.A.

(57) ABSTRACT

An integrated circuit device may include a semiconductor substrate including an active region and a transistor in the active region. The transistor may include first and second spaced apart source/drain regions in the active region of the semiconductor substrate, and a semiconductor channel region between the first and second source/drain regions. The semiconductor channel region may include a plurality of channel trenches therein between the first and second source/drain regions. A gate insulating layer may be provided on the channel region including sidewalls of the plurality of channel trenches, and a gate electrode may be provided on the gate insulating layer so that the gate insulating layer is between the gate electrode and the semiconductor channel region including the plurality of channel trenches. Related methods are also discussed.

10 Claims, 14 Drawing Sheets

INTEGRATED CIRCUIT SEMICONDUCTOR DEVICES INCLUDING CHANNEL TRENCHES AND RELATED METHODS OF MANUFACTURING

CROSS-REFERENCE TO RELATED APPLICATIONS

This U.S. non-provisional patent application claims priority under 35 U.S.C. §119 to Korean Patent Application No. 10-2011-0028315, filed on Mar. 29, 2011, the entire disclosure of which is incorporated by reference herein.

BACKGROUND

The present disclosure herein relates to integrated circuit devices and methods to manufacture the same and, more particularly, to semiconductor memory devices and methods to manufacture the same.

Generally, integrated circuit semiconductor memory devices may be classified as volatile or nonvolatile memory devices. A volatile memory device loses stored data when the power supply is interrupted. Volatile memory devices include, for example, dynamic random access memory (DRAM) and static random access memory (SRAM) devices. A nonvolatile memory device maintains stored data even when the power supply is interrupted. Nonvolatile memory devices include, for example, programmable ROM (PROM), erasable PROM (EPROM), electrically EPROM (EEPROM) and flash memory devices.

As the electronic industry develops further, further increases of integration density of semiconductor devices may be needed. However, if semiconductor devices are simply integrated by scaling down, various problems may occur. For example, if a minimum width of a semiconductor device is reduced to several tens of nanometers, margins of manufacturing processes of the semiconductor device may be reduced. Also, it may be difficult to optimize and/or match different characteristics of various elements (i.e, driving circuits and/or memory cells) respectively performing various functions in the semiconductor device.

SUMMARY

Embodiments of inventive concepts may provide a semiconductor memory device capable of improving integration densities and/or operating characteristics.

Embodiments of inventive concepts may provide methods of manufacturing a semiconductor memory device capable of improving integration densities and operating characteristics.

According to example embodiments of inventive concepts, a semiconductor memory device may include a semiconductor substrate including cell array regions and a core region between the cell array regions, phase-change memory cells in the cell array regions, and cell driving transistors in the core region to drive the phase-change memory cells. Each of the cell driving transistors may include: a gate electrode on the semiconductor substrate, dopant doped regions in the semiconductor substrate at both side of the gate electrode, and a gate insulating layer between the gate electrode and the semiconductor substrate. The semiconductor substrate between the dopant doped regions may have a plurality of fin-trenches, and the gate insulating layer and the gate electrode may cover inner surfaces of the fin-trenches.

According to other example embodiments of inventive concepts, a method of manufacturing a semiconductor memory device may include preparing a semiconductor substrate including a cell array region and a core region around the cell array region, and patterning the semiconductor substrate to form an isolation trench and a plurality of fin-trenches. The isolation trench may define a first active region in the cell array region and a second active region in the core region, and the plurality of fin-trenches may be formed in the second active region. A device isolation layer may be formed in the isolation trench. A gate insulating layer may be formed to conformally cover inner surfaces of the fin-trenches. A gate electrode may be formed crossing over the second active region, and the gate electrode may cover the inner surfaces of the fin-trenches on which the gate insulating layer is formed.

According to some embodiments of inventive concepts, a semiconductor memory device may include a semiconductor substrate with cell array regions and a core region between the cell array regions, and a plurality of phase-change memory cells in each of the cell array regions. In addition, cell driving transistors may be provided in the core region, and the cell driving transistors may be configured to drive the phase-change memory cells. More particularly, each of the cell driving transistors may include first and second spaced apart source/drain regions in the semiconductor substrate, a semiconductor channel region between the first and second source/drain regions with the semiconductor channel region including a plurality of channel trenches therein, a gate insulating layer on the semiconductor channel region including the plurality of channel trenches, and a gate electrode on the gate insulating layer so that the gate insulating layer is between the gate electrode and the semiconductor channel region including the plurality of channel trenches.

According to some other embodiments of inventive concepts, a method of manufacturing a semiconductor memory device may include preparing a semiconductor substrate including a cell array region and a core region around the cell array region, and patterning the semiconductor substrate to form an isolation trench and a plurality of channel trenches. The isolation trench may define a first active region in the cell array region and a second active region in the core region, and the plurality of channel trenches may be formed in the second active region. A device isolation layer may be formed in the isolation trench, and a gate insulating layer may be formed to conformally cover inner surfaces of the channel trenches. A gate electrode may be formed crossing over the second active region, with the gate electrode covering the inner surfaces of the channel trenches on which the gate insulating layer is formed.

According to still other embodiments of inventive concepts, an integrated circuit device may include a semiconductor substrate including an active region, and a transistor in the active region. The transistor may include first and second spaced apart source/drain regions in the active region of the semiconductor substrate, and a semiconductor channel region between the first and second source/drain regions. The semiconductor channel region may include a plurality of channel trenches therein between the first and second source/drain regions. A gate insulating layer may be on the channel region including sidewalls of the plurality of channel trenches, and a gate electrode may be on the gate insulating layer so that the gate insulating layer is between the gate electrode and the semiconductor channel region including the plurality of channel trenches.

BRIEF DESCRIPTION OF THE DRAWINGS

Inventive concepts will become more apparent in view of the attached drawings and accompanying detailed description.

DETAILED DESCRIPTION OF THE EMBODIMENTS

Figure 1:
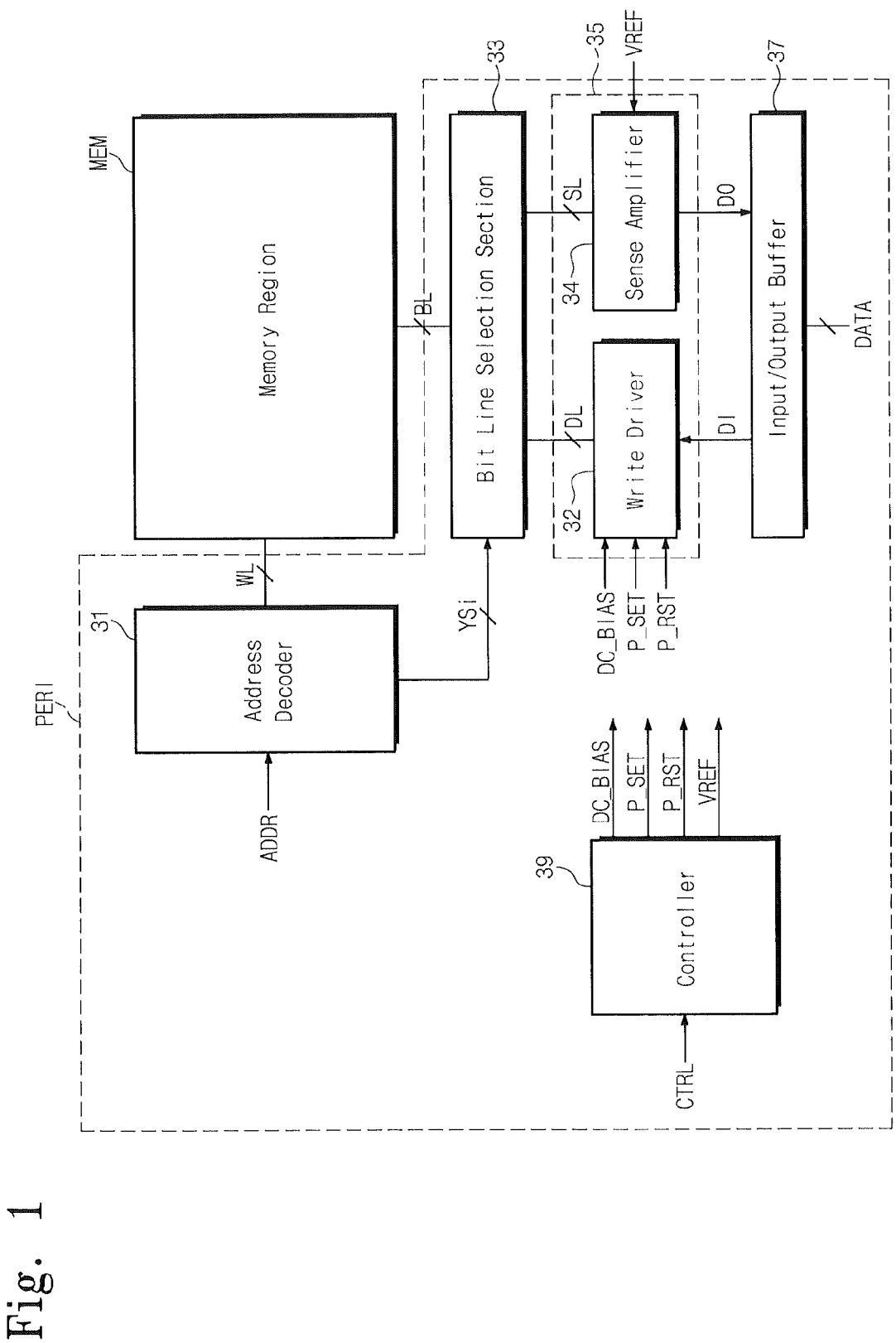
FIG. 1 is a schematic block diagram illustrating a semiconductor memory device according to embodiments of inventive concepts.

Inventive concepts will now be described more fully hereinafter with reference to the accompanying drawings, in which examples of embodiments of inventive concepts are shown. Advantages and features of inventive concepts and methods of achieving them will be apparent from the following embodiments that will be described in more detail with reference to the accompanying drawings. It should be noted, however, that inventive concepts are not limited to the following embodiments, and may be implemented in various forms. Accordingly, embodiments are provided herein only to disclose inventive concepts and let those skilled in the art know categories of inventive concepts. In the drawings, embodiments of inventive concepts are not limited to the specific examples provided herein and dimensions of the drawings may be exaggerated for clarity.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with sectional views as ideal exemplary views of inventive concepts. Accordingly, shapes of views may be modified according to manufacturing techniques and/or allowable errors. Therefore, embodiments of inventive concepts are not limited to specific shapes illustrated in the views, but may include other shapes that may be created according to manufacturing processes. Areas illustrated in the drawings may have general properties, and are used to illustrate specific examples of shapes of elements. Thus, these examples should not be construed as limiting a scope of inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from teachings of present inventive concepts. Examples of embodiments of aspects of present inventive concepts explained and illustrated herein include their complementary counterparts. The same reference numerals or the same reference designators denote the same elements throughout the specification.

Moreover, examples of embodiments are described herein with reference to cross-sectional illustrations and/or plan illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, regions illustrated in the figures are schematic in nature and their shapes are not intended to illustrate the actual shape of a region of a device and are not intended to limit the scope of example embodiments.

FIG. 1 is a schematic block diagram illustrating a semiconductor memory device according to embodiments of inventive concepts.

Referring to FIG. 1, a semiconductor memory device includes a memory region MEM and a peripheral circuit region PERI disposed around the memory region MEM.

According to some embodiments, a memory cell array and cell driver circuits driving memory cells may be disposed in the memory region MEM. The memory region MEM includes a plurality of word lines WL, a plurality of bit lines BL and the memory cells connected to cross-points of the word lines WL and the bit lines BL. Each of the memory cells may include a resistive memory element which is switched to one of two resistive states by applying an electrical pulse. For example, resistive memory elements may include phase-change materials, transition metal oxides and/or magnetic materials. In some embodiments, each of the memory cells may include a phase-change material of which a crystal state can be changed depending on the amount of a current through the phase-change material. Memory cells and cell selection circuits will be described in more detail with reference to FIGS. 2 and 3.

An address decoder 31, a bit line selection section 33, a data input/output circuit 35, an input/output buffer 37, and a controller 39 are disposed in the peripheral circuit region PERI.

The address decoder 31 decodes an address ADDR received from the outside thereby selecting a word line WL and a bit line BL. The address ADDR may include a row address to select the word line WL and a column address to select the bit line BL. The address decoder 31 generates a bit line selection signal YSi to select a bit line BL, and provides the bit line selection signal YSi to the bit line selection section 33.

The bit line selection section 33 is connected to the memory cell array through the bit lines BL. Also the bit line selection section 33 is connected to the data input/output circuit through a data line DL and a sensing line SL. The bit line selection section 33 electrically connects bit lines BL to data lines DL or connects bit lines BL to sensing lines SL in response to the bit line selection signal YSi provided from the address decoder 31. According to some embodiments, bit lines BL connected to the memory cells may have a hierarchical structure using a plurality of global bit lines and a plurality of local bit lines. If bit lines BL have a hierarchical structure, the bit line selection section 33 may include a global bit line selection section and a local bit line selection section. The global bit line selection section may select one of the global bit lines and the local bit line selection section may select one of the local bit lines. According to some embodiments, the global bit line selection section may be disposed in the peripheral circuit region PERI and the local bit line selection section may be disposed in the memory region MEM.

The data input/output circuit 35 writes data DI into the memory cell array, or reads data DO from the memory cell array. The data input/output circuit 35 includes a write driver 32 and a sense amplifier 34 to write the data DI and read the data DO.

The write driver 32 provides a program current (or a write current) to the selected bit line BL through the data line DL during a write operation. In more detail, the write driver 32 receives a set pulse P_SET or a reset pulse P_RST from the controller 39 to generate a set current or a reset current. The write driver 32 receives data DI from the input/output buffer 37 to provide a set current or a reset current to the selected bit line BL through the bit line selection section 33. Also, the write driver 32 can control an amount of current provided to the selected bit line BL according to a bias voltage DC_BIAS provided from the controller 39. That is, the write driver 32 may provide the set current for a selected memory cell in response to the set pulse P_SET when the data DI is a logic '0'. And the write driver 32 may provide the reset current for the selected memory cell in response to the reset pulse P_RST when the data DI is a logic '1'.

During a read operation, the sense amplifier 34 reads the data DO of a selected memory cell through the sensing line SE In more detail, the sense amplifier 34 provides a write current to the memory cell array through the sensing line SL during the read operation. During the read operation, the sense amplifier 34 compares a voltage of the sensing line SL with a reference voltage VREF, thereby reading the data stored in the selected memory cell. The data DO read from the write amplifier 34 is output from the memory device through the input/output buffer 37.

The input/output buffer 37 provides data DATA input from the outside the memory device to the write driver 32 or outputs data DATA read from the sense amplifier 34 to outside the memory device.

The controller 39 generates control signals controlling the semiconductor memory device according to a command signal CTRL provided from outside the memory device. That is, the controller 39 controls the write driver 32 during write operations, and controls the sense amplifier 34 during read operations. In more detail, the controller 39 provides the write driver 32 with the set pulse P_SET or the reset pulse P_RST to generate the program voltage. Controller 39 provides write driver 32 with bias voltage DC_BIAS to control an amount of current provided to the selected memory cell. Also, controller 39 provides the sense amplifier with the reference voltage VREF to compare with a voltage of the sensing line SL during read operations.

Figure 2:
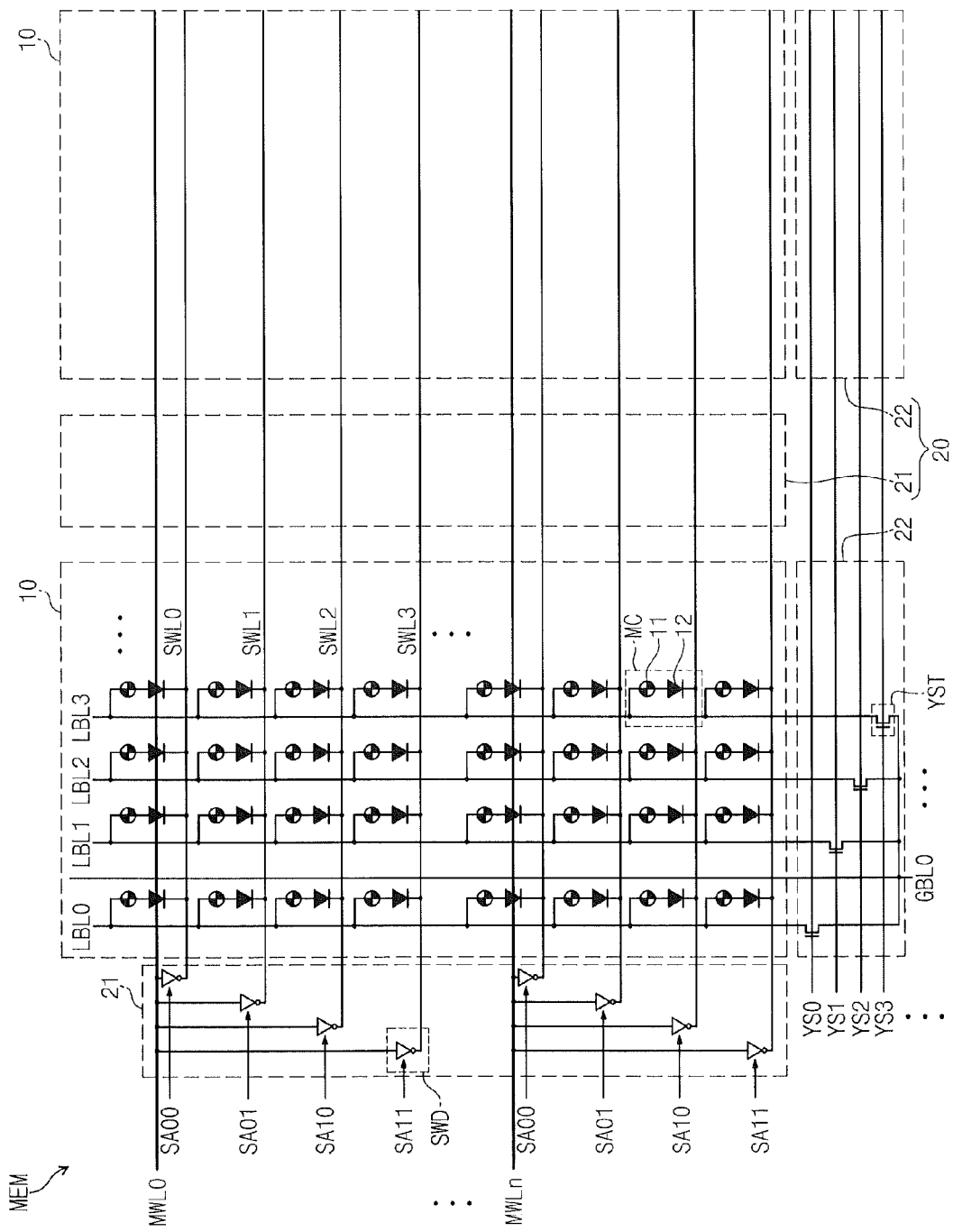
FIG. 2 is a schematic circuit diagram illustrating a semiconductor memory device according to embodiments of inventive concepts.

FIG. 2 is a schematic circuit diagram illustrating a semiconductor memory device according to some embodiments of inventive concepts.

Referring to FIG. 2, the memory region MEM includes cell array regions 10 and a core region 20 around the cell array regions 10.

A plurality of word lines and a plurality of bit lines are disposed in the cell array region 10, and memory cells MC are connected to cross-points of the word lines and bit lines, respectively. According to some embodiments, the memory cells MC may include a phase-change material having a crystal state that is changeable according to an amount of current through the phase-change material.

Core region 20 may include word line driver region 21 and bit line selection region 22. Word line drivers SWD used to select word lines may be disposed in word line driver region 21, and bit line selection circuits YST used to select the bit lines may be disposed in bit line selection region 22.

Cell array regions 10 may be arranged two dimensionally in a plan view, and core region(s) 20 may be disposed between cell array regions 10. According to some embodiments, word line driver region 21 may be disposed between a pair of the cell array regions 10 adjacent to each other in a first direction (i.e., a word line direction), and the bit line selection region 22 may be disposed between a pair of the cell array regions 10 adjacent to each other in a second direction (i.e., a bit line direction) perpendicular to the first direction.

In more detail, each of cell array regions 10 may include a plurality of word lines, a plurality of bit lines, and a plurality of memory cells MC. In an embodiment, as illustrated in FIG. 2, the word lines may have a hierarchical word line structure using a plurality of main word lines MWL and a plurality of sub word lines SWL. Also, the bit lines may have a hierarchical bit line structure using a plurality of global bit lines GBL and a plurality of local bit lines LBL. And at least two sub word lines SWL may be connected to each of the main word lines MWL through word line driver SWD. At least two local bit lines LBL may be connected to each of the global bit lines GBL. The memory cells MC may be connected at cross-points of sub word lines SWL and local bit lines LBL, respectively. In some embodiments, each of the memory cells MC may include a memory element 11 and a selection element 12. Memory element 11 may be connected between local bit line LBL and selection element 12, and selection element 12 may be connected between memory element 11 and sub word line SWL.

The memory element 11 may include a resistive memory element which is switched to one of at least two different resistive states. According to some embodiments, the memory element 11 may include a phase-change material such as GST(Ge—Sb—Te). Resistivity of the phase-change material may be changeable according to a temperature applied to the phase-change material. Resistivity of the phase-change material in an amorphous state may be higher than that of the phase-change material in a crystal state. The memory element 11 may be changeable between the amorphous state and the crystal state according to the amount of the current supplied through the local bit line LBL to generate heat. In more detail, the phase-change material in the memory element 11 may be heated to a temperature higher than a melting temperature of the phase-change material for a first time, and then the phase-change material in the memory element 11 may be rapidly cooled. As a result, the phase-change material in the memory element 11 may change to or remain in the amorphous state. When the phase-change material in the memory element 11 is the amorphous state, the memory cell MC may have a RESET state or a state storing data '1'. Alternatively, the phase-change material in the memory element 11 may be heated to a temperature higher than a crystallization temperature of the phase-change material and lower than the melting temperature for a second time longer than the first time, and then the phase-change material in the memory element 11 may be gradually cooled. As a result, the phase-change material in the memory element 11 may change to or remain in the crystal state. When the phase-change material in the memory element 11 is in the crystal state, the memory cell MC may have a SET state or a state storing a data '0'. As described above, data may be stored in the phase-change material by supplying the phase-change material with the current, and resistivity of the phase-change material is measured to read the data from the memory cell MC.

In some embodiments, the selection element 12 may be a PN junction diode. An anode of the PN junction diode may be connected to the memory element 11, and a cathode of the PN junction diode may be connected to the sub word line SWL. When a voltage difference between the anode and cathode of the PN junction diode is larger than a threshold voltage of the PN junction diode, the PN junction diode turns on, thereby supplying the memory element 11 with current.

According to some embodiments, the word line drivers SWD in the word line driver region 21 may connect one of the sub word lines SWL to the main word line MWL in response to sub word line selection signals SAi. Each of the word line drivers SWD may include an inverter comprising MOS transistors. Also, a plurality of the main word lines MWL may be connected to the address decoder 31 in the peripheral circuit region PERI in FIG. 1.

In some embodiments, the bit line selection circuits YST in the bit line selection region 22 may connect one of the local bit lines LBL to the global bit line GBL in response to local bit line selection signals YSi. The bit line selection circuits YST may include MOS transistors. Also, a plurality of the global bit lines GBL may be connected to the address decoder 31 and the bit line selection section 33 in the peripheral circuit region PERI in FIG. 1. According to some embodiments, when the bit lines have a hierarchical bit line structure using the plurality of global bit lines GBL and the plurality of local bit lines LBL, the local bit line selection circuits YST may be disposed in the bit line selection region 22.

In some embodiments, when the memory element 11 includes the phase-change material, the word line drivers SWD and the bit line selection circuits YST in the core region 20 controls the amount of the current provided to the memory cells MC. That is, the amount of the current provided to the memory elements 11 may be controlled by driving performances of the word line drivers SWD and the bit line selection circuits YST.

In some embodiments, in the event that word line drivers SWD and the bit line selection circuits YST are formed of MOS transistors, since the MOS transistors may be respectively connected to the sub word lines SWL and the local bit lines LBL, a ratio of a planar area of the MOS transistors and a wire structure connected to the MOS transistors may increase. That is, a planar area of the core region 20 may be greater than a planar area of the cell array region 10 in the semiconductor memory device. Additionally, a ratio of the planar area of the core region 20 with respect to the planar area of the cell array region 10 may be greater than that of other memory elements (except for resistive memory elements).

Also, driving performances of MOS transistors forming the word line drivers SWD and bit line selection circuits YST can be improved by increasing channel widths of the MOS transistors. However, as channel widths of the MOS transistors increase, a planar area of the core region 20 may increase. Therefore, embodiments of present inventive concepts may provide a semiconductor memory device capable of improving driving performances of word line drivers SWD and bit line selection circuits YST and reducing a planar area of core region 20.

Figure 3:
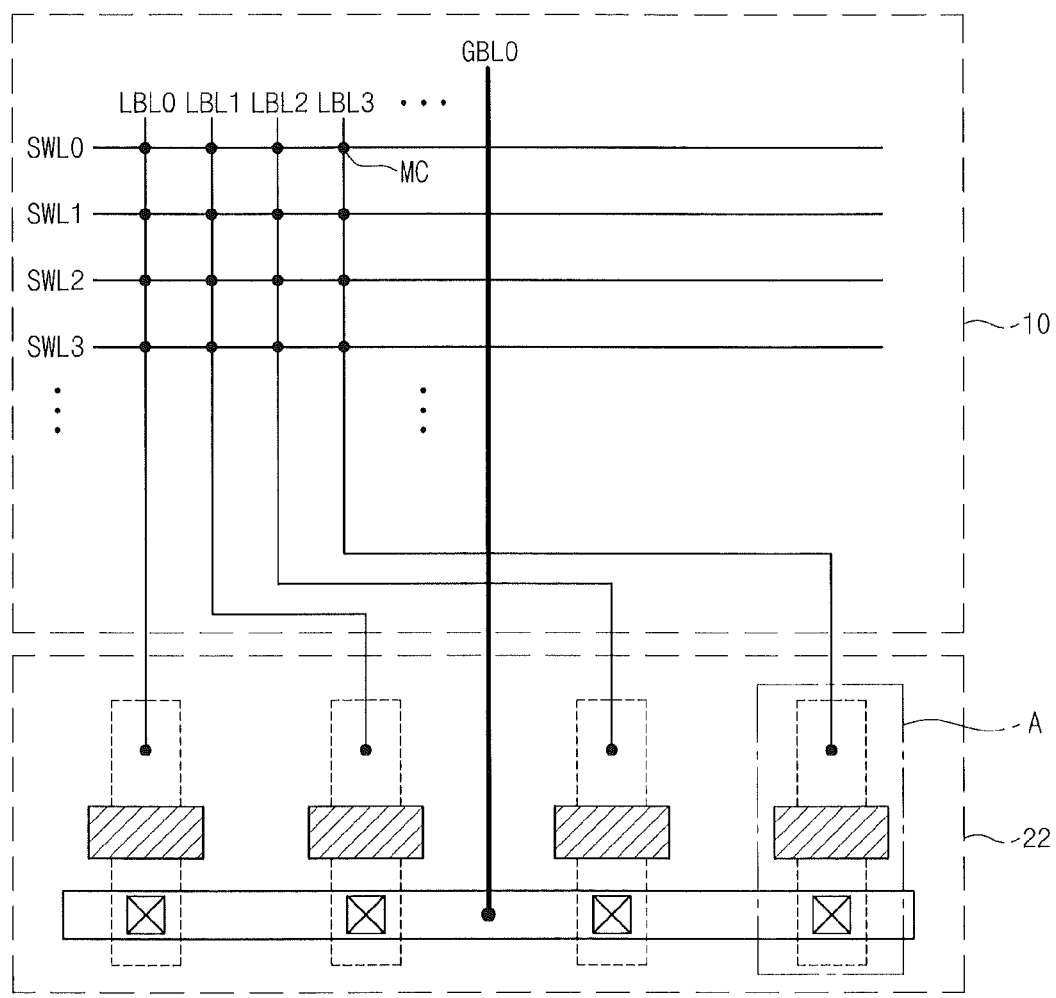
FIG. 3 is a plan view illustrating a memory region of a semiconductor memory device according to embodiments of inventive concepts.
Figure 4:
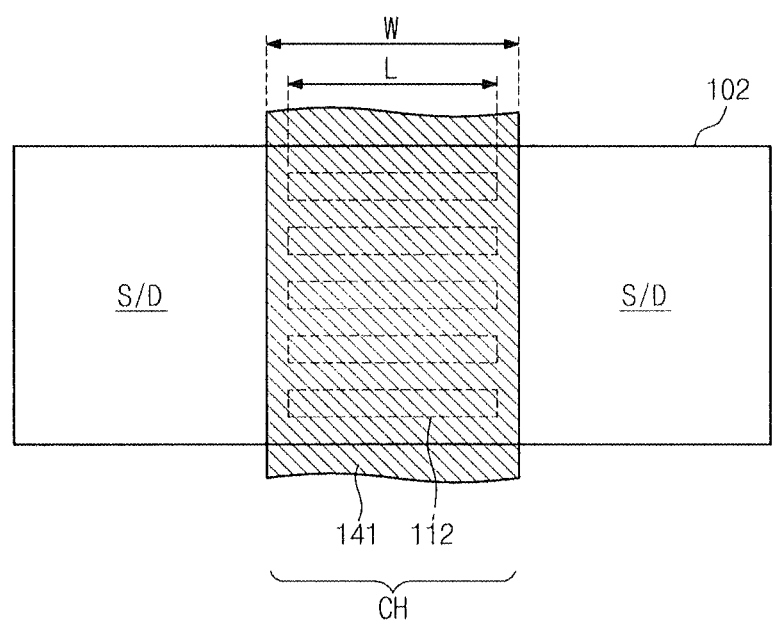
FIG. 4 is an enlarged view illustrating a portion 'A' in FIG. 3 to explain a core region of a semiconductor memory device according to embodiments of inventive concepts.
Figure 5:
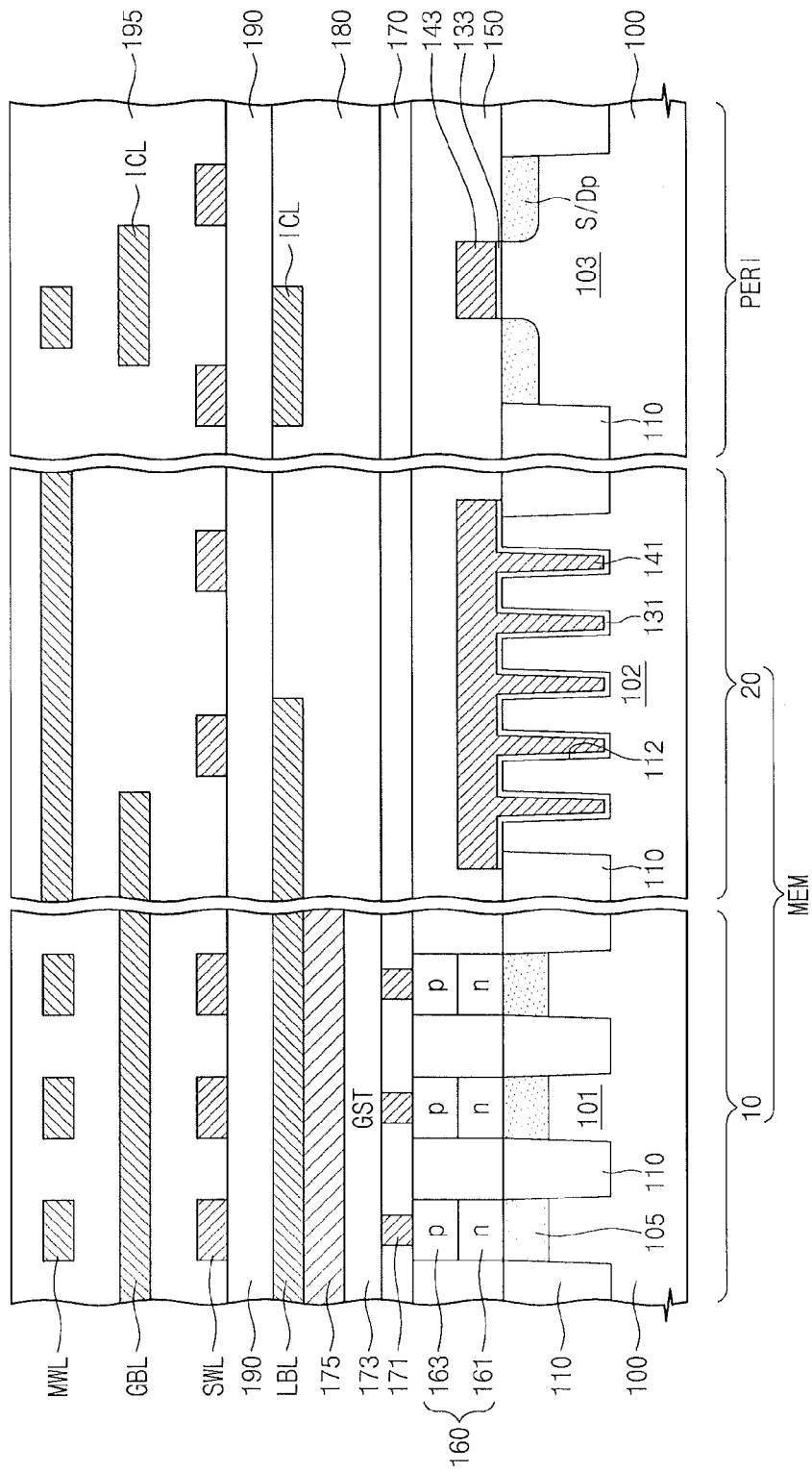
FIG. 5 is a cross sectional view illustrating a semiconductor memory device according to embodiments of inventive concepts.

FIG. 3 is a plan view illustrating a memory region of a semiconductor memory device according to some embodiments of inventive concepts, and FIG. 4 is an enlarged view illustrating a portion 'A' in FIG. 3 to explain a core region of a semiconductor memory device according to some embodiments of inventive concepts. FIG. 5 is a cross sectional view illustrating a semiconductor memory device according to some embodiments of inventive concepts.

Referring to FIGS. 3 to 5, a semiconductor substrate 100 includes the memory region MEM and the peripheral circuit region PERI, and the memory region MEM includes the cell array region 10 and the core region 20. As described with respect to FIG. 2, memory elements 11 and selection elements 12 may be formed on semiconductor substrate 100 in cell array region 10. Also, the word line drivers (SWD in FIG. 2) and the bit line selection circuits (YST in FIG. 2), which control a supply of current to the memory cells MC, may be formed on semiconductor substrate in core region 20.

In more detail, device isolation layer 110 may be formed on the semiconductor device to define cell active regions 101, core active regions 102, and peripheral active regions 103. Cell active region 101 may have substantially a line shape in a plan view, and core active region 102 may have substantially a rectangular shape in a plan view. A top surface of device isolation layer 110 may be substantially coplanar with a top surface of semiconductor substrate 100, but embodiments of inventive structures are not limited thereto. Alternatively, device isolation layer 110 may protrude above the top surface of the semiconductor substrate 100. That is, the top surface of the semiconductor substrate 100 may be disposed at a level lower than that of the top surface of the device isolation layer 110.

As illustrated in FIG. 5, conductive lines 105 may be respectively formed in the cell active regions 101 by doping with dopants and/or by patterning a conductive layer. The conductive line 105 may be self-aligned with the device isolation layer 110. When the semiconductor substrate 100 of the cell active region 101 are doped with dopants of a first conductivity type, conductive lines 105 may be formed by doping with dopants of a second conductivity type different than the first conductivity type. In some embodiments, conductive line 105 may correspond to sub word line SWL in FIG. 2.

As illustrated in FIG. 4, each of core active regions 102 may include a channel region CH and dopant doped regions S/D disposed at opposite sides of channel region CH. Portions of semiconductor substrate 100 corresponding to the channel region CH may have a plurality of fin-trenches 112, and a plurality of fins may be formed in the channel region CH. Each of the fins may be disposed between a pair of adjacent fin-trenches 112, and each of the fins may protrude above a bottom surface of the fin-trench 112. That is, the channel region CH may have a concave-convex shape due to the fin-trenches 112.

In some embodiments, each of core active regions 102 may have a rectangular shape with a major axis and a minor axis in a plan view. Similarly, each of the fin-trenches 112 may have a rectangular shape with a major axis and a minor axis in a plan view. The major axes of fin-trenches 112 may be substantially parallel with the major axis of core active region 102. A length of core active region 102 may be greater than a length of fin-trench 112 in a longitudinal direction parallel with the major axis. A vertical depth of bottom surfaces of fin-trenches 112 from the top surface of semiconductor substrate 100 may be substantially the same as a vertical depth of a bottom surface of the device isolation layer 110 from the top surface of the semiconductor substrate 100. A width of fin-trench 112 may be smaller than a width of core active region 102. For example, at least two fin-trenches 112 may be formed in channel region CH. The width of fin-trench 112 may have a range of about ½ of the width of core active region 102 to about 1/240 of the width of core active region 102. Also, a length L of fin-trench 112 having the rectangular shape may be less than a width W of a gate electrode 141 crossing over channel region CH.

The gate electrode 141 is disposed in core region 20. Gate electrode 141 crossing over core active region 102 is disposed on portions of semiconductor substrate 100 of channel region CH. A gate insulating layer 131 is interposed between the gate electrode 141 and the semiconductor substrate 100 of the channel region CH. Gate insulating layer 131 may conformally and continuously cover inner surfaces of the fin-trenches 112 and top surfaces of the fins. The gate electrode 141 may cross over the plurality of fin-trenches 112 on which gate insulating layer 131 is formed. Gate electrode 141 may cover the plurality of fin-trenches 112 on which the gate insulating layer 131 is formed. In more detail, gate electrode 141 may cover inner surfaces of the plurality of fin-trenches 112 and top surfaces of the fins. Gate electrode 141 may partially or fully fill the fin-trenches 112 on which gate insulating layer 131 is formed. As described above, the width W of the gate electrode 141 may be greater than the length L of the major axis of the respective fin-trenches 112. Gate electrode 141 may include a poly silicon layer, a multi-layer having a poly silicon layer and a silicide layer stacked thereon, and/or a metal layer.

As described above, because gate electrode 141 covering at least inner surfaces of fin-trenches 112 is formed in core region 20, an inversion region(i.e, a channel) may be formed along a surface of semiconductor substrate 100 having the fin-trenches 112 by supplying a predetermined voltage to gate electrode 141. For example, the inversion region (i.e. channel) may be generated along the inner surfaces of the fin-trenches 112 and the top surfaces of the fins. That is, an effective channel width of a cell driving transistor (i.e. MOS transistor) having the fin-trenches 112 and the gate electrode 141 can be greater than a width of the core active region 102. As a result, the amount of a turn on current between a source electrode and a drain electrode (that is, the dopant doped regions S/D at both side of the gate electrode 141) can increase.

Figure 7:
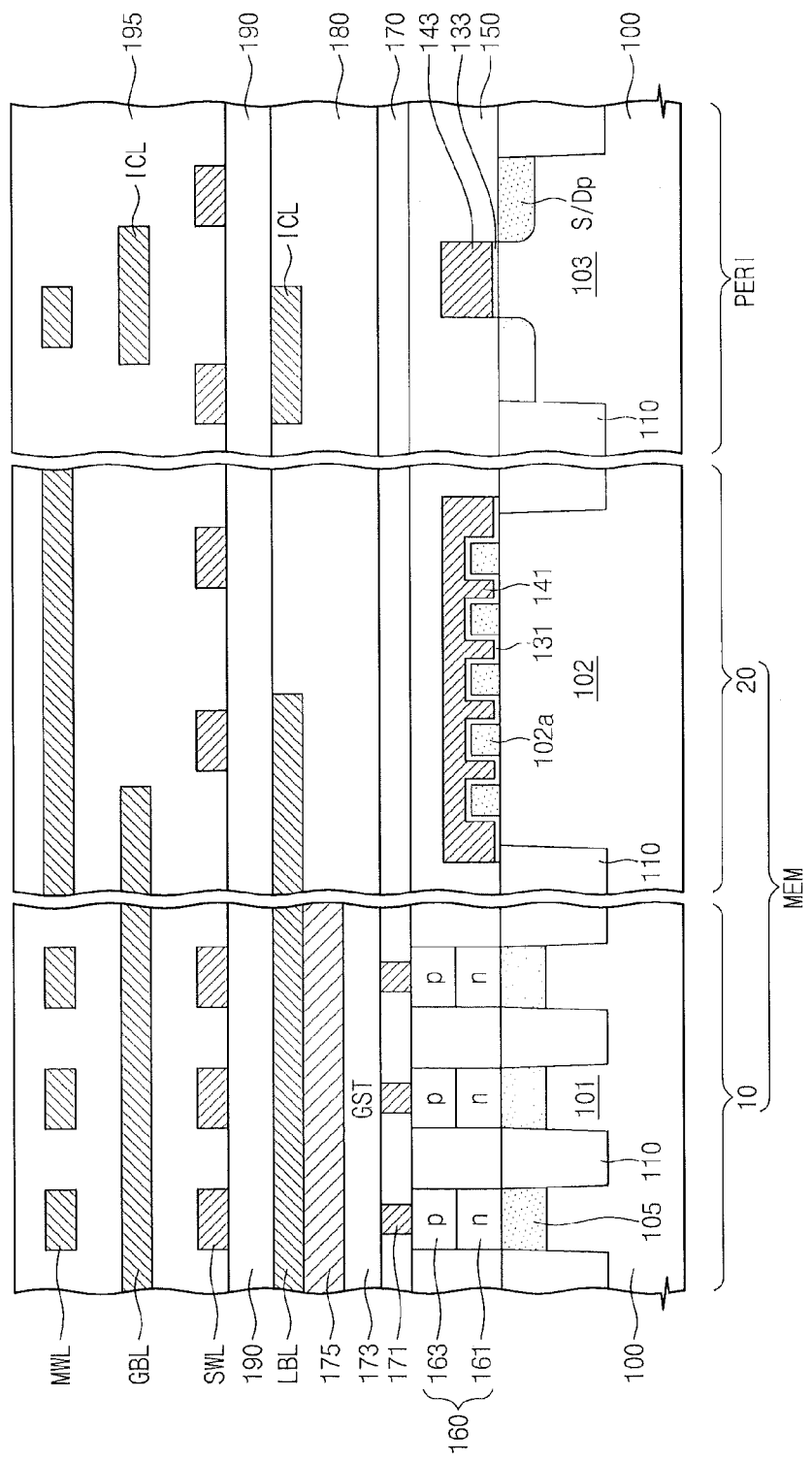

Meanwhile, according to other embodiments of inventive concepts as illustrated in FIG. 7, active patterns 102a (instead of the fin-trenches 112) may be formed on the semiconductor substrate 100 at core active regions 102. Each of active patterns 102a may have a rectangular shape. That is, active patterns 102a, which have the rectangular shapes parallel with the major axis of the core active region 102, may be disposed on semiconductor substrate 100 at core active region 102. In present embodiments, a top surface of semiconductor substrate 100 in core active region 102 may be flat. The active patterns 102a may be spaced apart from each other, and top surfaces of active patterns 102a may be higher than the top surface of semiconductor substrate 100. Also, each of the active patterns 102a may have both sidewalls parallel with the major axis of the core active region 102. As a result, a channel region of the core active region 102 according to present embodiments may have a concave and convex surface caused by active patterns 102a. According to present embodiments, each of cell driving transistors in core region 20 may include a plurality of active patterns 102a, a gate insulating layer 131 conformally covering surfaces of active patterns 102a and semiconductor substrate 100 of core active region 102, and a gate electrode disposed on gate insulating layer 131 and covering the plurality of active patterns 102a. In the cell driving transistor in FIG. 7, when a predetermined voltage is supplied to gate electrode 141, a channel (inversion region) may be generated at surfaces and sidewalls of active patterns 102a and at surfaces of semiconductor substrate 100 between active patterns 102a.

Peripheral active region 103 may include a peripheral channel region and peripheral source/drain regions S/Dp disposed at both sides of the peripheral channel region. In some embodiments, a peripheral gate insulating layer 133 may be disposed on a flat top surface of the semiconductor substrate 100 in the peripheral active region 103, and peripheral gate electrode 143 crossing over the peripheral active region 103 may be disposed on the peripheral gate insulating layer 133. Peripheral gate electrode 143 may be disposed over portions of semiconductor substrate 100 in the peripheral channel region. A peripheral transistor may include peripheral gate electrode 143, the peripheral channel region, and peripheral source/drain regions S/Dp.

Figure 6:
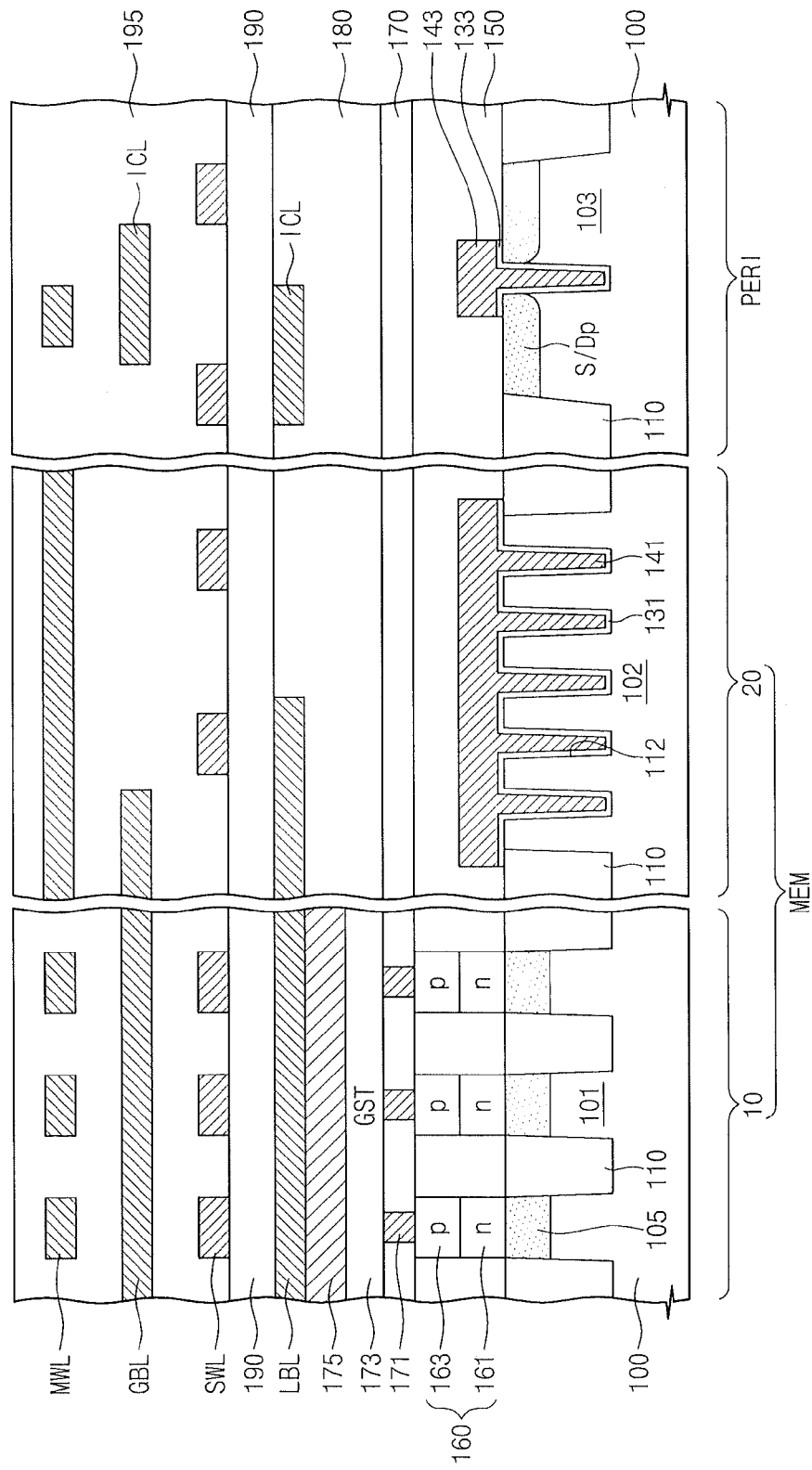
FIGS. 6 and 7 are cross sectional views illustrating a semiconductor memory device according to other embodiments of inventive concepts.

Alternatively, as illustrated in FIG. 6, at least one peripheral trench may be formed in semiconductor substrate 100 of the peripheral channel region in peripheral active region 103. In this case, peripheral gate electrode 143 may extend to fill the peripheral trench. A vertical depth of the peripheral trench formed in peripheral active region 103 may be substantially the same as the vertical depth of fin-trench 112.

A first interlayer insulating layer 150 may be formed on semiconductor substrate 100 including cell array region 10 having conductive lines 105, core region 20 having cell driving transistors, and peripheral circuit region PERI having the peripheral transistor.

Referring to FIGS. 5 to 7, first interlayer insulating layer 150 of cell array region 10 has cell holes, and the cell holes may be arranged two dimensionally in a plan view. The cell holes may expose predetermined regions of conductive lines 105, respectively. A diode 160 is disposed in each of the cell holes to be electrically connected to respective conductive lines 105. In more detail, diode 160 may include first semiconductor layer 161 and second semiconductor layer 163. First semiconductor layer 161 is doped with dopants having the same conductivity type as the conductive line 105, and second semiconductor layer 163 is doped with dopants having a conductivity type different from first semiconductor layer 161. That is, the first and second semiconductor layers 161 and 163 in a cell hole define/provide a PN junction to provide PN junction diode 160. Each of first and second semiconductor layers 161 and 163 constituting the diode 160 may be formed of silicon, germanium, and/or silicon-germanium.

Second interlayer insulating layer 170 may be disposed on first interlayer insulating layer 170. Lower electrodes 171 may be disposed the second interlayer insulating layer 170 the cell array region 10. Lower electrodes 171 may be disposed on respective diodes 160. Each of lower electrodes 171 may have a pillar shape, a "L"-shape or a "U"-shape. A planar area of a bottom surface of each lower electrode 171 may be less than a planar area of a top surface of the respective diode 160. A planar area of a top surface of a lower electrode 171 may be smaller than a planar area of a bottom surface of a variable resistance pattern 173. Each lower electrode 171 may include at least one of a conductive metal nitride, a conductive metal oxynitride, a metal, and/or a conductive carbon compound. For example, each lower electrode 171 may include at least one of Ti, TiSi, TiN, TiON, TiW, TiAlN, TiAlON, TiSiN, TiBN, W, WSi, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN, Ru, CoSi, NiSi, conductive carbon group, Cu, and/or combinations thereof. In some embodiments, a, metal silicide layer for an ohmic contact may be interposed between each lower electrode 171 and respective diode 160.

Variable resistance patterns 173 may be respectively and separately formed at cross-points of conductive lines 105 in cell active regions 101 and wire lines LBL crossing over the conductive lines 105. Alternatively, variable resistance patterns 173 may have line shapes. Variable resistance patterns 173 having line shapes may be parallel with conductive lines 105, or may be perpendicular to conductive lines 105 in a plan view. Each of variable resistance patterns 173 may be connected to diode(s) 160 through respective lower electrode(s) 171, and may be connected to the wire line LBL (i.e. local bit line) through an upper electrode(s) 175. Alternatively, the variable resistance patterns may be directly connected to wire lines LBL without contact plugs and/or electrodes.

In some embodiments, each of variable resistance patterns 173 may include a phase-change material having at least one chalcogenide element such as tellurium (Te) and/or selenium (Se). For example, each of variable resistance patterns 173 may include at least one of Ge—Sb—Te, As—Sb—Te, As—Ge—Sb—Te, Sn—Sb—Te, Ag—In—Sb—Te, In—Sb—Te, a group 5A element-Sb—Te, a group 6A element-Sb—Te, a group 5A element-Sb—Se, a group 6A element-Sb—Se, Ge—Sb, In—Sb, Ga—Sb, and/or a doped Ge—Sb—Te material. A doped Ge—Sb—Te material may be doped with at least one of C, N, B, Bi, Si, P, Al, Dy, and/or Ti. Upper electrode 175 may include at least one of a conductive metal nitride, a conductive metal oxynitride, a metal, and/or a conductive carbon compound. Upper electrode 175 may be formed of a same material as the lower electrode. For example, upper electrode 175 may include at least one of Ti, TiSi, TiN, TiON, TiW, TiAlN, TiAlON, TiSiN, TiBN, W, WSi, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN, Ru, CoSi, NiSi, conductive carbon group, Cu, and/or combinations thereof.

A phase of the variable resistance pattern 173 having the phase-change material may be changed by Joule heating. Joule heat may be generated using current supplied through lower electrode 171. Joule heat may increase in proportion to a time that the current is applied and/or a resistivity of the phase-change material.

Third interlayer insulating layer 180 may cover variable resistance patterns 173. Upper electrode 175 (connected to the variable resistance pattern 173) may be disposed in third interlayer insulating layer 180 in cell array region 10. Wire plugs (not shown) may be formed in third interlayer insulating layer 180 in core region 20 and peripheral circuit region PERI. In some embodiments, upper electrodes 175 may have a plug shape and may be locally disposed on respective separate variable resistance patterns 173, or a line shape extending along variable resistance pattern 173.

Stacked wire lines LBL, SWL, GBL, MWL and ICL with interlayer insulating layers 190 and 195 therebetween may be disposed on third interlayer insulating layer 180. In more detail, as described with reference to FIGS. 2 and 3, local bit lines LBL, sub word lines SWL, global bit lines GBL and main word lines MWL may be formed in cell array region 10. Connection wires ICL may be disposed in core region 20 and peripheral circuit region PERI.

Wire lines LBL, SWL, GBL and MWL in cell array region 10 may extend into core region 20. Local bit lines LBL may be selectively connected to global bit lines GBL using cell driving transistors in core region 20. Also, sub word lines SWL may be selectively connected to main word lines MWL using cell driving transistors in core region 20. Meanwhile, sub word lines SWL may be electrically connected to the conductive lines 105 (which are formed by doping with dopants) through a cell strapping contact.

FIGS. 8 to 13 are cross sectional views illustrating operations of manufacturing a semiconductor memory device according to some embodiments of inventive concepts.

Figure 8:
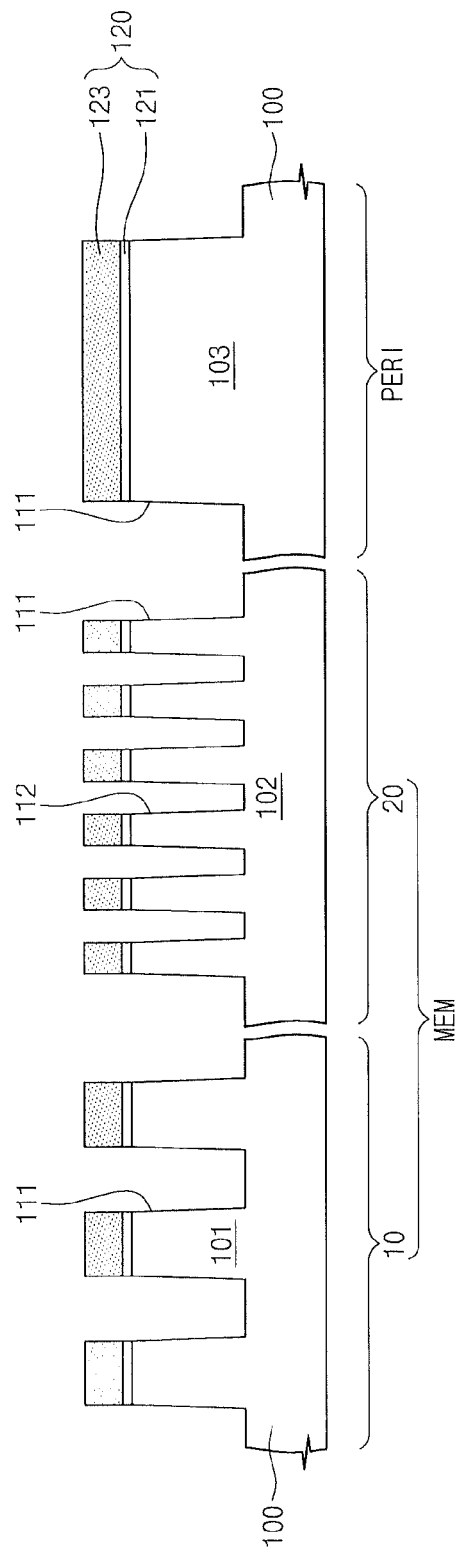
FIGS. 8 to 13 are cross sectional views illustrating operations of manufacturing a semiconductor memory device according to embodiments of inventive concepts.

Referring to FIG. 8, semiconductor substrate 100 is prepared. Semiconductor substrate 100 may include memory region MEM and peripheral circuit region PERI. Memory region MEM includes cell array region 10 and core region 20. For example, semiconductor substrate 100 may be a bulk silicon substrate, a silicon-on-insulator (SOI) substrate, a germanium substrate, a germanium-on-insulator (GOI) substrate, a silicon-germanium substrate, and/or a substrate having a thin epitaxial layer formed using a selective epitaxial growth (SEG) process.

Semiconductor substrate 100 may be patterned to form isolation trenches 111 defining cell, core and peripheral active regions 101, 102 and 103. Portions of semiconductor substrate 100 of core active region 102 may be patterned to form fin-trenches 112. Isolation trenches 111 and fin-trenches 112 may be formed simultaneously. In some embodiments, isolation trenches 111 and fin-trenches 112 may be formed by forming mask patterns 120 to define isolation trenches 111 and fin-trenches 112, and anisotropically etching semiconductor substrate 100 using mask patterns 120 as an etch mask. Each of mask patterns 120 may include a pad oxide pattern 121 and a hard mask pattern 123 sequentially stacked. Also, each of isolation trenches 111 and fin-trenches 112 may have inclined/sloped sidewalls.

Cell active region 101, core active region 102, and peripheral active region 103 may be respectively defined in cell array region 10, core region 20 and peripheral circuit region PERI using isolation trenches 111. Cell active region 101 may have a line shape in a plan view. Each of core active regions 102 may have a rectangular shape in a plan view as illustrated in FIGS. 3 and 4. Also, a width of each of cell active regions 101 may be smaller than a width of each of core active regions 102.

A plurality of fin-trenches 112 may be formed in each of core active regions 102. In more detail, each of fin-trenches 112 may have a rectangular shape in a plan view, and a major axis of each of fin-trenches 112 may be parallel with a major axis of core active region 102. Since isolation trenches 112 and fin-trenches 112 are formed simultaneously, a vertical depth of isolation trenches 111 may be substantially the same as a vertical depth of fin-trenches 112. As illustrated in FIG. 4, a width of each of fin-trenches 112 may be less than the width of core active region 102. For example, the width of each fin-trench 112 may be in a range from about $\frac{1}{2}$ of the width of core active region 102 to about $\frac{1}{240}$ of the width of core active region 102.

Figure 9:
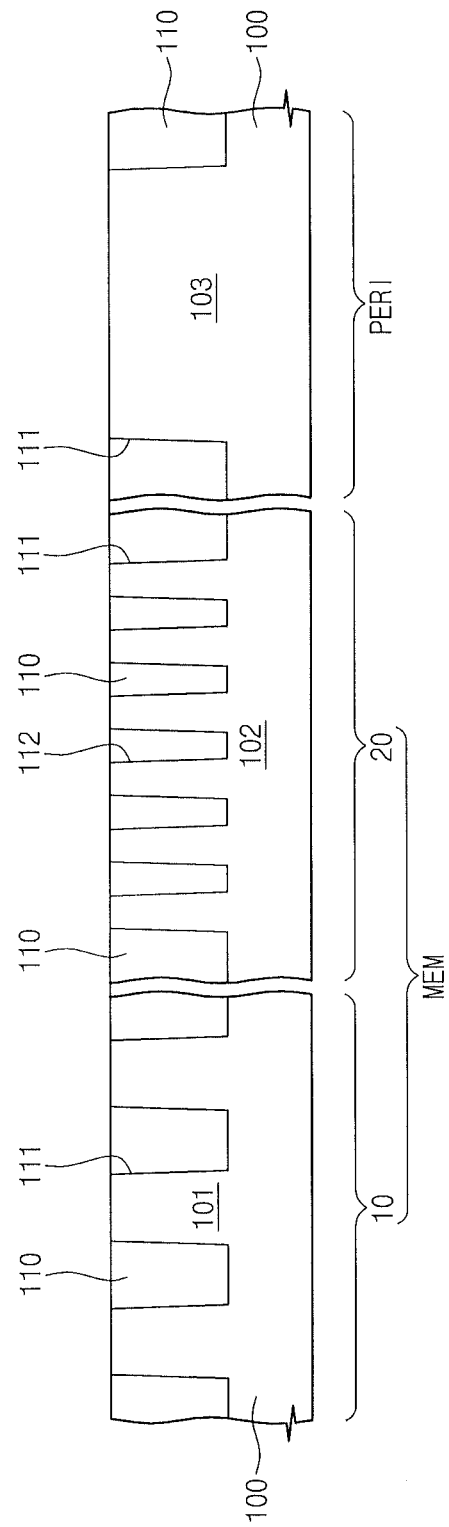

Referring to FIG. 9, device isolation layer 110 may be formed to fill isolation trenches 111 and fin-trenches 112.

In some embodiments, before forming device isolation layer 110, the mask patterns (120 in FIG. 8) used to form isolation trenches 111 and fin-trenches 112 may be removed. After removing the mask patterns (120 in FIG. 8), a filling insulating layer may be formed on the semiconductor substrate 100 having isolation trenches 111 and fin-trenches 112, and then the filling insulating layer may be planarized until a surface of the semiconductor substrate is exposed, thereby forming the device isolation layer 110. The filling insulating layer (and thus the device isolation layer 110) may be formed of a high density plasma (HDP) oxide layer, a borophosphosilicate glass (BPSG) layer, an undoped silicate glass (USG) layer, and/or a spin on glass (SOG) layer. In some embodiments, before forming the filling insulating layer, a liner layer (not shown) may be conformally formed on inner surfaces of isolation trenches 111 and fin-trenches 112 to reduce a stress which occurs due to volume expansion of the filling insulating layer.

Alternatively, the filling insulating layer may be formed on an entire surface of the semiconductor substrate 100 including trenches 111 and 112 and mask patterns 120, and then the filling insulating layer may be planarized until top surfaces of mask patterns 120 of FIG. 8 are exposed, thereby forming device isolation layer 110. After forming device isolation layer 110, mask patterns 120 in FIG. 8 may be removed. In this case, device isolation layer 110 may protrude above the top surface of the semiconductor substrate 100.

Figure 10:
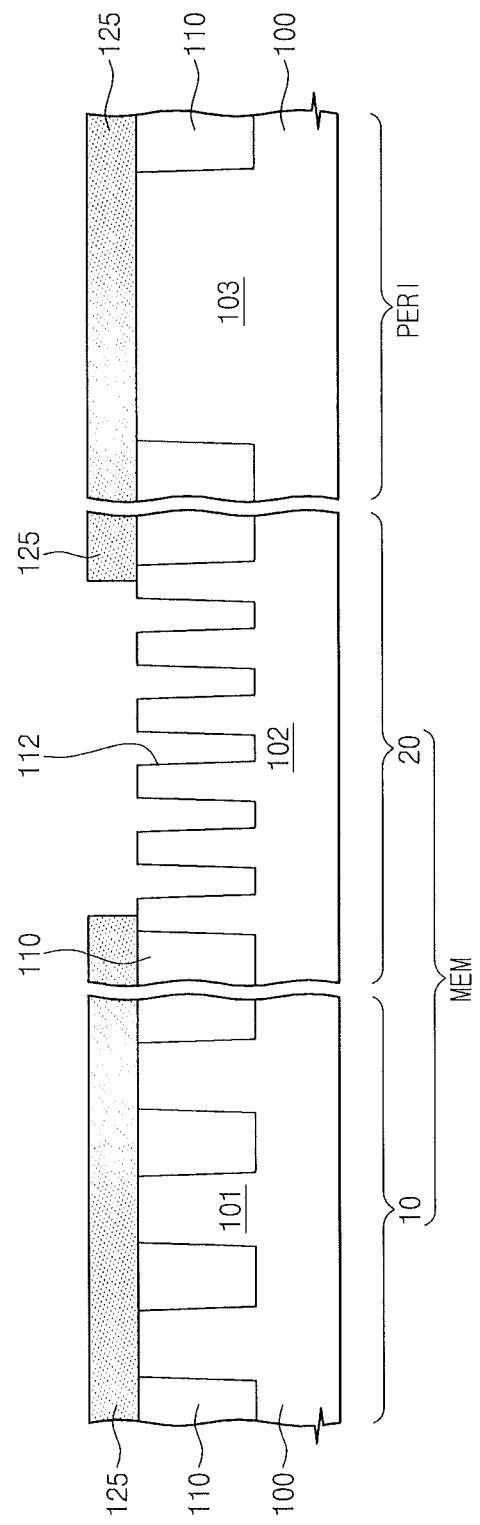

Referring to FIG. 10, portions of device isolation layer 110 filling fin-trenches 112 in core region 20 may be removed using a selective etching process, thereby exposing inner surfaces of fin-trenches 112.

In more detail, core mask pattern 125 may be formed on semiconductor substrate 110. Core mask pattern 125 may have an opening which exposes portions of device isolation layer 110 in fin-trenches 112 and crosses over core active region 102. And then, portions of device isolation layer 110 in fin-trenches 112 may be removed using a wet etching process using core mask pattern 125 as a etch mask, so that the inner surfaces of fin-trenches 112 may be exposed. When device isolation layer 110 is formed of a silicon oxide layer, the wet etching process to remove the device isolation layer 110 in fin-trenches 112 may use a standard cleaning-1 (SC1) solution, a LAL solution, and/or HF solution. A plurality of fins may be defined by the fin-trenches 112 in semiconductor substrate 100 in the core active region. Core mask pattern 125 may be removed after exposing the inner surfaces of fin-trenches 112.

Figure 11:
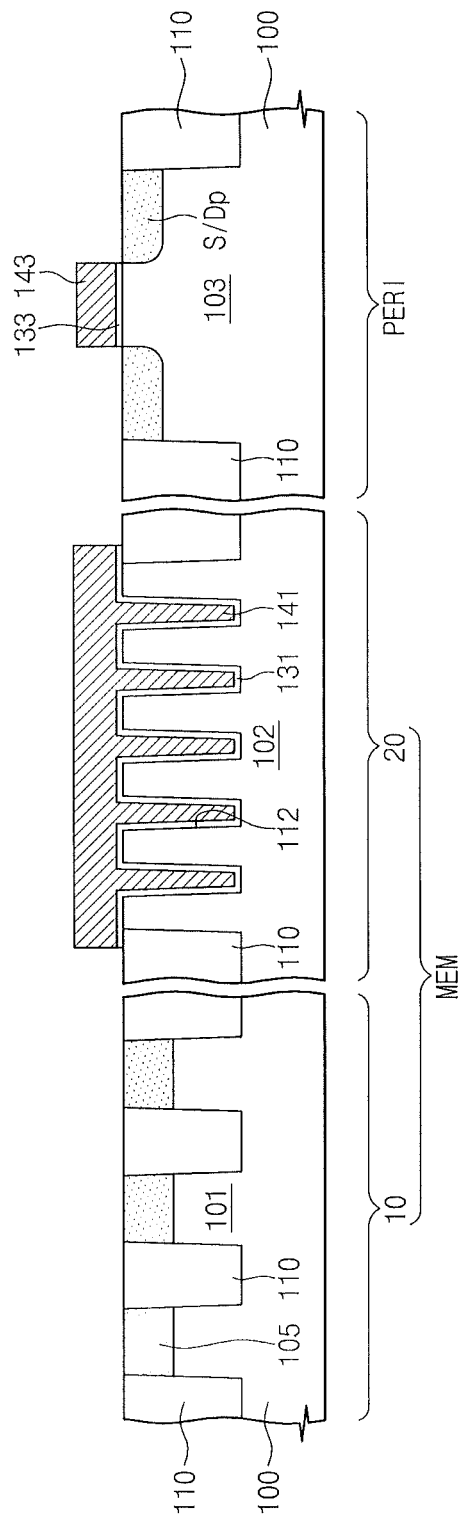

Referring to FIG. 11, gate insulating layers 131 and 133 may be formed on the semiconductor substrate 100 having the exposed fin-trenches 112.

The gate insulating layers 131 and 133 may be formed by performing a thermal oxidation process. The thermal oxidation process may be a dry oxidation process using $O_2$ or a wet oxidation process using $H_2O$. Alternatively, the gate insulating layers 131 and 133 may be formed using a deposition technique that provides a high degree of and/or excellent step coverage. For example, gate insulating layers 131 and 133 may be formed using a chemical vapor deposition (CVD) technique and/or an atomic layer deposition (ALD) technique. Gate insulating layers 131 and 133 may be formed on surfaces of cell active region 101 having fin-trenches 112, core active region 102, and peripheral active region 103.

A gate conductive layer may be formed on the gate insulating layers 131 and 133, and then, the gate conductive layer may be patterned to form gate electrodes 141 and 143 in core region 20 and peripheral circuit region PERI. The gate conductive layer may fill fin-trenches 112 on which gate insulating layer 131 is formed. The gate conductive layer may be formed using a deposition technique providing a high degree of and/or excellent step coverage. For example, the gate conductive layer may be formed using a chemical vapor deposition (CVD) technique and/or an atomic layer deposition (ALD) technique. The gate conductive layer may include at least one of a conductive poly silicon layer, a metal layer, a metal nitride layer, and/or a metal silicide layer.

After forming gate electrodes 141 and 143 in core region 20 and peripheral circuit region PERI, dopant doped regions S/D may be formed in portions of semiconductor substrate 100 in core active region 102 at both sides of gate electrode 141 by implanting dopant ions. The dopant doped regions S/D may correspond to source and/or drain regions of a cell driving transistor. Peripheral source/drain regions S/Dp may be formed in portions of semiconductor substrate 100 in peripheral active region 103 at both sides of the gate electrode 143 by implanting dopant ions. As a result, the cell driving transistors in core region 20 and the peripheral transistor may be formed.

A conductive line 105 may be formed by doping portions of semiconductor substrate 100 of cell active region 101 with dopants. The dopant doped regions S/D, the peripheral source/drain regions S/Dp, and the conductive lines 105 may be doped with dopants having a different conductivity type from dopants of the semiconductor substrate 100. For example, when semiconductor substrate 100 is p type, the dopant doped regions S/D, the peripheral source/drain regions S/Dp and the conductive lines 105 may be doped with n type dopants. In some embodiments, the conductive lines 105 may be self-aligned with device isolation layer 110.

Alternatively, conductive lines 105 may be formed by depositing a conductive material and patterning the conductive material. In this case, conductive lines 105 may be formed on the top surface of semiconductor substrate 100 in the cell active region 101.

Figure 12:
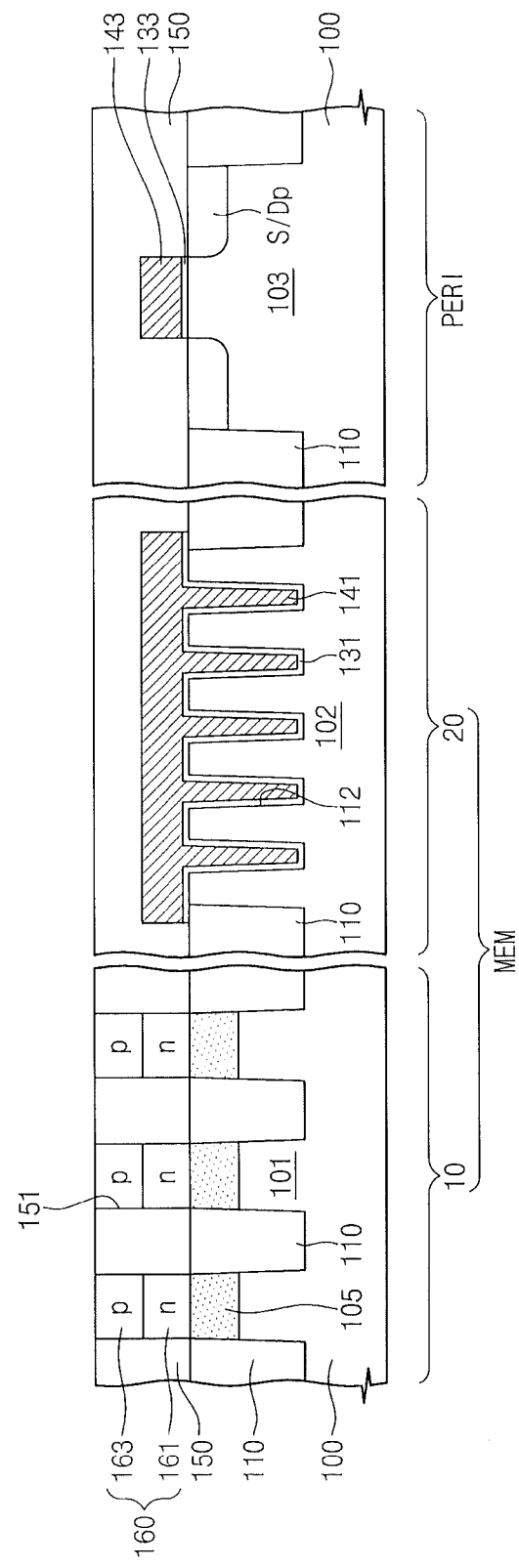

Referring to FIG. 12, first interlayer insulating layer 150 may be formed on an entire surface of semiconductor substrate 100. First interlayer insulating layer 150 may cover the cell driving transistor of core region 20 and the peripheral transistor of the peripheral circuit region PERI. For example, first interlayer insulating layer 150 may be formed of at least one of a borophosphosilicate glass (BPSG) layer, a high density plasma (HDP) oxide layer, a tetra ethyl ortho silicate (TEOS) layer, an undoped silicate glass (USG) layer, and/or a tonen silazene (TOSZ) material. First interlayer insulating layer 150 may be formed using a deposition technique providing a high degree of and/or excellent step coverage. For example, first interlayer insulating layer 150 may be formed using a chemical vapor deposition (CVD) technique and/or an atomic layer deposition (ALD) technique. After depositing first interlayer insulating layer 150, an upper portion of first interlayer insulating layer 150 may be planarized using a chemical mechanical polishing (CMP) process and/or an etch back process.

First interlayer insulating layer 150 may be patterned to form cell holes 151 respectively exposing predetermined regions of conductive lines 105. In some embodiments, cell holes 151 may be arranged in a matrix form when viewed from a plan view.

Diodes 160 may be separately formed in each of the cell holes 151. Each of diodes 160 in cell holes 151 may include a first semiconductor layer 161 and a second semiconductor layer 163. The first semiconductor layer 161 may be doped with a dopant having the same conductivity type as the conductive lines 105 in the cell active region 101, and the second semiconductor layer 163 may be doped with dopants having a different conductivity type than the first semiconductor layer 161. In more detail, forming diodes 160 may include forming an epitaxial layer filling each of the cell holes 151 after forming the cell holes 151. The epitaxial layer may be formed using a selective epitaxial growth technique using portions conductive lines 105 exposed by the cell holes 151 as a seed. Thereafter, n type dopants may be supplied (e.g., by implanting) into a lower portion of the epitaxial layer in the cell hole 151 to form the first semiconductor layer 161, and p type dopants may be supplied (e.g., by implanting) into an upper portion of the epitaxial layer disposed on the first semiconductor layer 161 to form the second semiconductor layer 163. Alternatively, during the selective epitaxial growth, n type dopants and p type dopants may be sequentially supplied using an in-situ method. The first and second semiconductor layers 161 and 163 in the cell holes 151 may provide PN junctions to form diodes 160 including the PN junctions.

Figure 13:
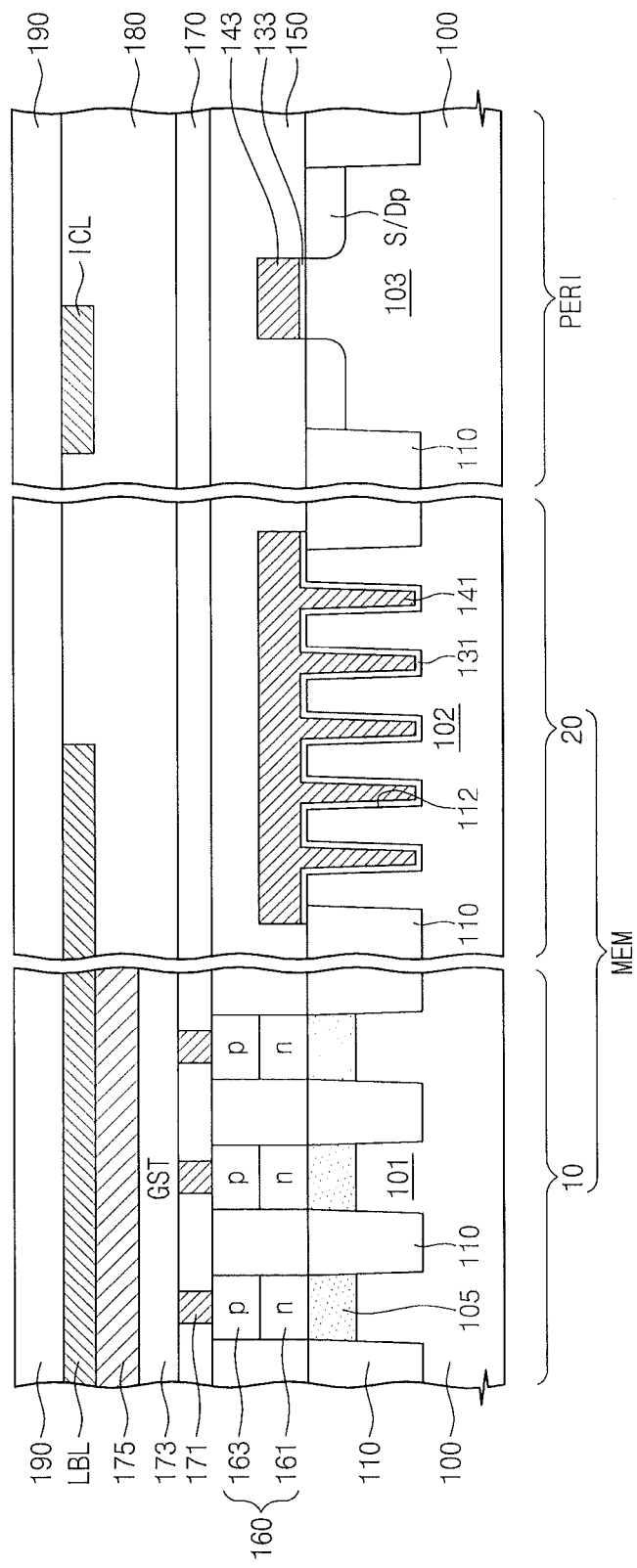

Referring to FIG. 13, second interlayer insulating layer 170 may be formed on first interlayer insulating layer 50 including diodes 160, and then lower electrodes 171 may be formed in second interlayer insulating layer 170. Lower electrodes 171 may be connected to diodes 160, respectively.

Second interlayer insulating layer 170 may be patterned to form lower electrode-holes, and then each of the lower electrode-holes may be filled with a conductive material, thereby forming lower electrodes 171. Each of lower electrodes 171 may have a circular shape, a ring shape or an arc shape when viewed from a plan view. For example, each of lower electrodes 171 may include at least one of Ti, TiSi, TiN, TiON, TiW, TiAlN, TiAlON, TiSiN, TiBN, W, WSi, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN, Ru, CoSi, NiSi, conductive carbon group, Cu, and/or combinations thereof.

A variable resistance pattern 173 may be formed on each of lower electrodes 171. In some embodiments, variable resistance 173 may include a phase-change material having at least one chalcogenide element such as tellurium (Te) and/or selenium (Se). For example, variable resistance pattern 173 may include at least one of Ge—Sb—Te, As—Sb—Te, As—Ge—Sb—Te, Sn—Sb—Te, Ag—In—Sb—Te, In—Sb—Te, a group 5A element-Sb—Te, a group 6A element-Sb—Te, a group 5A element-Sb—Se, a group 6A element-Sb—Se, Ge—Sb, In—Sb, Ga—Sb, and/or a doped Ge—Sb—Te material. A doped Ge—Sb—Te material may be doped with at least one of C, N, B, Bi, Si, P, Al, Dy or Ti. A phase-change material layer may be formed using a physical vapor deposition (PVD) process and/or a chemical vapor deposition (CVD) process, and then the phase-change material layer may be patterned to form variable resistance pattern 173. In some embodiments, before the phase-change material layer is patterned, a capping electrode layer may be formed on the phase-change material layer, and the capping electrode layer and the phase-change material layer may be successively patterned to form the variable resistance pattern 173 (e.g. phase-change pattern) and a capping electrode sequentially stacked thereon.

After forming variable resistance patterns 173 in cell array region 10, third interlayer insulating layer 180 may be formed on an entire surface of semiconductor substrate 100. Thereafter, upper electrode 175 (connected to variable resistance pattern 173) may be formed in third interlayer insulating layer 180 in cell array region 10. Wire plugs (not shown) may be formed in third interlayer insulating layer 180 in core region 20 and peripheral circuit region PERI. Upper electrode 175 and wire plugs (not shown) may be formed from a same material as the lower electrode 171.

In some embodiments, a local bit line LBL (which is connected to upper electrode 175 and crosses over conductive lines 105) may be formed using a damascene process. Upper electrode 175 and local bit line LBL may include at least one of a conductive metal nitride, a conductive metal oxynitride, a metal, and/or a conductive carbon compound. For example, each of upper electrode 175 and local bit line LBL may include at least one of Ti, TiSi, TiN, TiON, TiW, TiAlN, TiAlON, TiSiN, TiBN, W, WSi, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN, Ru, CoSi, NiSi, conductive carbon group, Cu, and/or combinations thereof.

As illustrate in FIG. 5, stacked wire lines SWL, GBL, MWL, and ICL with interlayer insulating layers 190 and 195 therebetween may be formed on third interlayer insulating layer 180. As described with reference to FIGS. 2 and 3, wire lines SWL, GBL and MWL may be the sub word line SWL, the global bit line GBL, and the main word line MWL. The wire line ICL may correspond to the connection wire ICL in core region 20 and/or peripheral circuit region PERI. Wire lines LBL, SWL, GBL and MWL in cell array region 10 may be extended into core region 20.

Figure 14:
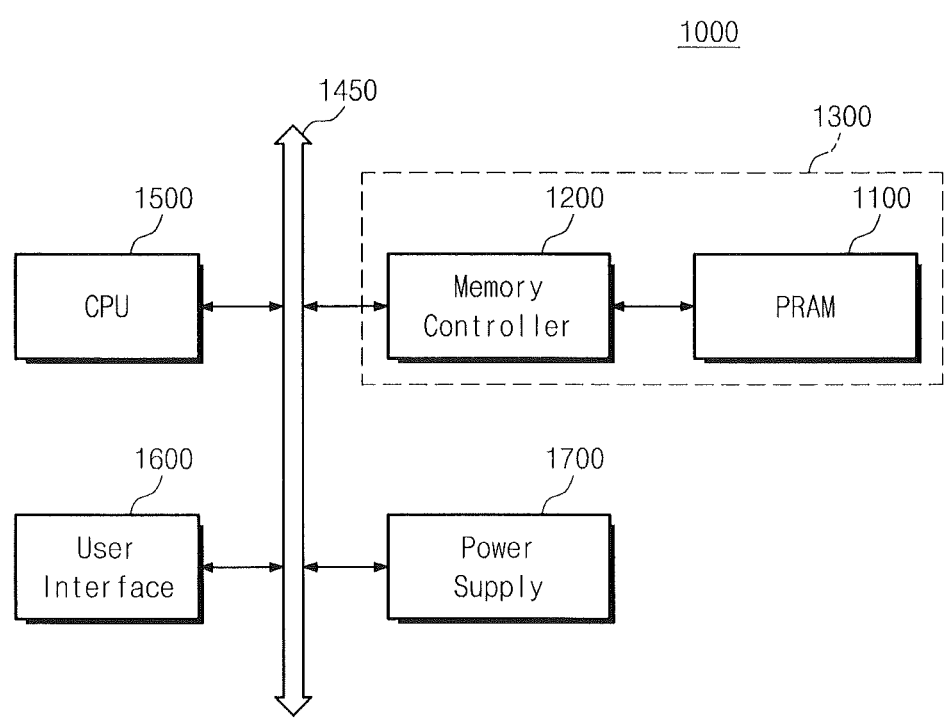
FIG. 14 is a block diagram illustrating an information processing system including a semiconductor memory device according to embodiments of inventive concepts.

FIG. 14 is a block diagram illustrating an information processing system including a semiconductor memory device according to some embodiments of inventive concepts.

Referring to FIG. 14, information processing system 1000 according to some embodiments of present inventive concepts may include memory system 1300 having semiconductor memory device 1100 (e.g., a PRAM) and memory controller 1200, system bus 1450, central processing unit 1500, user interface 1600, and power supply 1700. Memory system 1300, central processing unit 1500, user interface 1600, and power supply 1700 may be electrically connected to system bus 1450. Semiconductor memory device 1100 may be a semiconductor memory device according to embodiments of inventive concepts discussed above with respect to FIGS. 1-13.

Data provided through user interface 1600 and/or processed by the central processing unit 1500 may be stored in semiconductor memory device 1100 through memory controller 1200. Semiconductor memory device 1100 may constitute a solid state drive (SSD). In this case, a writing speed of memory system 1300 may be greatly improved.

Although not illustrated in the drawings, the information processing system 1000 according to embodiments of present inventive concepts may further include an application chipset, a camera image processor (CIS), a mobile DRAM, or the like.

According to embodiments of present inventive concepts set forth above, fin-trenches may be formed in a channel region of a cell driving transistor used to drive memory cells, thus an effective channel width of the cell driving transistor may increase. As a result, a current driving performance provided to the memory cell may increase and/or an integration density of the semiconductor memory device may increase.

While present inventive concepts have been described with reference to example embodiments, it will be apparent to those skilled in the art that various changes and modifications may be made without departing from the spirit and scope of inventive concepts. Therefore, it should be understood that the above embodiments are not limiting, but illustrative. Thus, the scope of inventive concepts is to be determined by the broadest permissible interpretation of the following That which is claimed is:

1. A semiconductor memory device comprising:
a semiconductor substrate including cell array regions and a core region between the cell array regions;
a plurality of phase-change memory cells in each of the cell array regions; and
cell driving transistors in the core region configured to drive the phase-change memory cells, wherein each of the cell driving transistors comprises,
first and second spaced apart source/drain regions in the semiconductor substrate,
a semiconductor channel region between the first and second source/drain regions, wherein the semiconductor channel region includes a plurality of channel trenches therein,
a gate insulating layer on the semiconductor channel region including the plurality of channel trenches, and
a gate electrode on the gate insulating layer so that the gate insulating layer is between the gate electrode and the semiconductor channel region including the plurality of channel trenches.

2. The semiconductor memory device of claim 1, further comprising:
a device isolation layer on portions of the semiconductor substrate in the core region wherein the device isolation layer defines a plurality of active regions, wherein each of the active regions includes a respective one of the cell driving transistors,
wherein each of the active regions has a rectangular shape having an active region length and an active region width less than the active region length in a plane of a surface of the semiconductor substrate, wherein each of the channel trenches has a rectangular shape having a trench length and a trench width less than the trench length in the plane, and wherein the active region length is substantially parallel with the trench length of the channel trenches therein.

3. The semiconductor memory device of claim 2, wherein a depth of a bottom surface of the device isolation layer into the semiconductor substrate is substantially the same as a depth of a bottom surface of each of the channel trenches into the semiconductor substrate.

4. The semiconductor memory device of claim 2, wherein the trench width of each of the channel trenches is in a range of about ½ to about 1/140 of the active region width.

5. The semiconductor memory device of claim 2, wherein the gate electrode of one of the cell driving transistors crosses continuously over the channel trenches of the respective semiconductor channel region, and wherein the trench length of the channel trenches of the respective semiconductor channel region is less than a width of the gate electrode of the cell driving transistor in a direction of the trench length.

6. The semiconductor memory device of claim 1, further comprising:
a device isolation layer in the semiconductor substrate to define a first active region in the cell array region and a second active region in the core region,
wherein a depth of a bottom surface of the device isolation layer from a surface of the semiconductor substrate is substantially the same as a depth of a bottom surface of each of the channel trenches from the surface of the semiconductor substrate.

7. The semiconductor memory device of claim 1, wherein the semiconductor substrate further comprises a peripheral circuit region around the cell array and core regions, wherein the peripheral circuit region includes peripheral circuits therein, and wherein the portions of the semiconductor substrate in the cell array and peripheral circuit regions have a substantially planar active surface.

8. The semiconductor memory device of claim 7, wherein one of the peripheral circuits comprises:
a peripheral gate electrode on the active surface of the semiconductor substrate in the peripheral circuit region;
peripheral source/drain regions on opposite sides of the peripheral gate electrode; and
a peripheral gate insulating layer between the peripheral gate electrode and the semiconductor substrate.

9. The semiconductor memory device of claim 1 further comprising:
a word line in the cell array region; and
a bit line crossing the word line in the cell array region;
wherein one of the phase change memory cells comprises a diode and a phase-change pattern electrically coupled in series between the word line and the bit line.

10. The semiconductor memory device of claim 9, wherein the word line and the bit line are electrically connected to respective ones of the cell driving transistors.

* * * * *